(12) United States Patent
Lee

(10) Patent No.: US 11,901,417 B2
(45) Date of Patent: *Feb. 13, 2024

(54) GAN/DIAMOND WAFERS

(71) Applicant: RFHIC Corporation, Anyang-si (KR)

(72) Inventor: Won Sang Lee, Chapel Hill, NC (US)

(73) Assignee: RFHIC Corporation, Anyang-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/678,967

(22) Filed: Feb. 23, 2022

(65) Prior Publication Data

US 2022/0238657 A1 Jul. 28, 2022

Related U.S. Application Data

(62) Division of application No. 16/905,870, filed on Jun. 18, 2020, now Pat. No. 11,502,175.

(Continued)

(51) Int. Cl.
*H01L 21/02* (2006.01)
*H01L 29/20* (2006.01)
(Continued)

(52) U.S. Cl.
CPC ...... *H01L 29/2003* (2013.01); *H01L 21/0254* (2013.01); *H01L 21/02378* (2013.01);
(Continued)

(58) Field of Classification Search
None
See application file for complete search history.

(56) References Cited

U.S. PATENT DOCUMENTS 5,939,201 A 8/1999 Boire et al.
6,951,556 B2 10/2005 Epstein
(Continued)

FOREIGN PATENT DOCUMENTS

CN 1996556 A 7/2007
JP 2013-125971 A 6/2013
(Continued)

OTHER PUBLICATIONS

Ejeckam, Felix et al. "GaN-on-Diamond: A Brief History," 2014 Lester Eastman Conference on High Performance Devices (LEC), pp. 1-5, available at https://ieeexplore.ieee.org/stamp/stamp.jsp?tp=&arnumber=6951556 (Year: 2014).
(Continued)

*Primary Examiner* — Jack S Chen
(74) *Attorney, Agent, or Firm* — Kim & Stewart LLP

(57) ABSTRACT

Wafers including a diamond layer and a semiconductor layer having III-Nitride compounds and methods for fabricating the wafers are provided. A nucleation layer, at least one semiconductor layer having III-Nitride compound and a protection layer are formed on a silicon substrate. Then, a silicon carrier wafer is glass bonded to the protection layer. Subsequently the silicon substrate, nucleation layer and a portion of the semiconductor layer are removed. Then, an intermediate layer, a seed layer and a diamond layer are sequentially deposited on the III-Nitride layer. Next, a substrate wafer that includes a glass substrate (or a silicon substrate covered by a protection layer) is glass bonded to the diamond layer. Then, the silicon carrier wafer and the protection layer are removed.

11 Claims, 8 Drawing Sheets

Related U.S. Application Data

(60) Provisional application No. 62/971,869, filed on Feb. 7, 2020.

(51) Int. Cl.
   *H01L 21/768* (2006.01)
   *H01L 29/205* (2006.01)
   *H01L 29/267* (2006.01)
   *H01L 29/66* (2006.01)
   *H01L 29/16* (2006.01)
   *H01L 23/00* (2006.01)

(52) U.S. Cl.
   CPC .. *H01L 21/02488* (2013.01); *H01L 21/02527* (2013.01); *H01L 21/76871* (2013.01); *H01L 21/76897* (2013.01); *H01L 24/94* (2013.01); *H01L 29/1602* (2013.01); *H01L 29/205* (2013.01); *H01L 29/267* (2013.01); *H01L 29/66462* (2013.01)

(56) References Cited

U.S. PATENT DOCUMENTS

| | | | |
|---|---|---|---|
| 7,749,863 | B1 | 7/2010 | Micovic |
| 7,884,373 | B2 | 2/2011 | Korenstein et al. |
| 7,943,485 | B2 | 5/2011 | Francis et al. |
| 8,674,405 | B1 | 3/2014 | Babic et al. |
| 8,940,620 | B2 | 1/2015 | Koudymov et al. |
| 9,711,534 | B2 | 7/2017 | Liang et al. |
| 10,043,700 | B2 | 8/2018 | Francis |
| 10,128,107 | B1 | 11/2018 | Cho et al. |
| 2002/0173120 | A1 | 11/2002 | Enquist |
| 2004/0029359 | A1 | 2/2004 | Letertre et al. |
| 2005/0164482 | A1 | 7/2005 | Saxler |
| 2006/0266280 | A1 | 11/2006 | Francis et al. |
| 2008/0142813 | A1 | 6/2008 | Chang et al. |
| 2008/0206569 | A1 | 8/2008 | Whitehead et al. |
| 2009/0078943 | A1 | 3/2009 | Ishida et al. |
| 2009/0133811 | A1 | 5/2009 | Moriceau et al. |
| 2010/0012947 | A1 | 1/2010 | Faure |
| 2010/0155900 | A1 | 6/2010 | Korenstein et al. |
| 2011/0186959 | A1 | 8/2011 | Jerome et al. |
| 2012/0168773 | A1 | 7/2012 | Sung |
| 2013/0157440 | A1 | 6/2013 | Koudymov et al. |
| 2013/0292691 | A1 | 11/2013 | Henley et al. |
| 2014/0038392 | A1 | 2/2014 | Yonehara et al. |
| 2015/0255591 | A1 | 9/2015 | Sadaka |
| 2016/0308010 | A1 | 10/2016 | Viswanathan et al. |
| 2017/0372965 | A1 | 12/2017 | Nishibayashi et al. |
| 2018/0151404 | A1 | 5/2018 | Francis |
| 2018/0366558 | A1 | 12/2018 | Kaplun et al. |
| 2019/0326162 | A1 | 10/2019 | Kaplun et al. |
| 2020/0273717 | A1 | 8/2020 | Dai et al. |
| 2022/0181450 | A1* | 6/2022 | Lee .................. H01L 21/76898 |

FOREIGN PATENT DOCUMENTS

| | | |
|---|---|---|
| KR | 10-2011-0099720 A | 9/2011 |
| KR | 10-2017-0137180 A | 12/2017 |
| TW | 200826322 A | 6/2008 |
| TW | 200905731 A | 2/2009 |
| TW | 201324704 A | 6/2013 |

OTHER PUBLICATIONS

Notice of Allowance dated Apr. 18, 2022 in U.S. Appl. No. 16/914,477, 13 pages.
Non-Final Office Action dated May 25, 2022 in U.S. Appl. No. 16/897,329, 43 pages.
Notice of Allowance dated Jun. 13, 2022 in U.S. Appl. No. 16/914,474, 13 pages.
Notice of Allowance dated Jan. 13, 2023 in U.S. Appl. No. 16/897,329, 10 pages.
Office Action dated Dec. 17, 2021 in Taiwan Patent Application No. 110120356 with machine translation, 9 pages.
Office Action dated Feb. 18, 2022 in Taiwan Patent Application No. 110120357 with machine translation, 7 pages.
Office Action dated Dec. 21, 2021 in Taiwan Patent Application No. 110120362 with machine translation, 4 pages.
Office Action dated Dec. 17, 2021 in Taiwan Patent Application No. 110120366 with machine translation, 10 pages.
Non-Final Office Action dated Mar. 3, 2022 in U.S. Appl. No. 16/905,870, 11 pages.
Non-Final Office Action dated Mar. 3, 2022 in U.S. Appl. No. 16/914,474, 11 pages.
Non-Final Office Action dated Dec. 24, 2021 in U.S. Appl. No. 16/914,477, 13 pages.

* cited by examiner

GAN/DIAMOND WAFERS

CROSS-REFERENCE TO PRIOR APPLICATIONS

This application is a divisional of U.S. patent application Ser. No. 16/905,870, filed Jun. 18, 2020, which application claims priority to U.S. Provisional Application No. 62/971,869, filed Feb. 7, 2020, which are hereby incorporated by reference in their entirety.

BACKGROUND

A. Technical Field

The present invention relates to semiconductor wafers, and more particularly, to wafers having a diamond layer and a semiconductor layer including III-nitride semiconductor material and methods for fabricating the wafers and devices.

B. Background of the Invention

Gallium Nitride (GaN) or AlGaN or AlN has electrical and physical properties that make it highly suitable for radio frequency (RF) devices, such as high electron mobile transistors (HEMTs). In general, an RF device produces a large amount of heat energy during operation, requiring a mechanism to extract the heat energy from the device to avoid device failure. Diamond is known to have a good thermal conductivity and can be used as material for a substrate on which the AlGaN/GaN layer is formed.

One conventional approach to form an AlGaN/GaN HEMT layer on a diamond layer is depositing AlGaN/GaN HEMT layer directly on a silicon substrate, removing the silicon substrate and forming a diamond layer on the AlGaN/GaN HEMT layer. This approach is attractive for its low manufacturing cost. However, the conventional technique is not suitable for manufacturing AlGaN/GaN HEMT in a consistent manner. First, the thickness of the wafers is much less than 200 µm, where a typical semiconductor processing equipment has robot arms for carrying semiconductor wafers and the robot arms require that the thickness of each wafer is at least 500 µm. Second, the conventional wafers are very thin, the wafers may not have sufficient mechanical strength to withstand the thermal and mechanical stresses during the subsequent processes for forming semiconductor devices in wafers. Thus, there is a need for a new technique for providing mechanical strength for the wafers and to meet the requirement for the robot arms used in the semiconductor processing.

SUMMARY OF THE DISCLOSURE

According to one aspect of the present invention, a semiconductor wafer includes: a substrate wafer; a bonding layer disposed on the substrate wafer; a diamond layer disposed on the bonding layer; an intermediate layer formed on the diamond layer; and at least one semiconductor layer disposed on the intermediate layer and including a III-Nitride compound.

According to one aspect of the present invention, a method for fabricating a semiconductor wafer includes: disposing a nucleation layer on a substrate; disposing at least one semiconductor layer on the nucleation layer, the at least one semiconductor layer including a III-Nitride compound; disposing a protection layer on the at least one semiconductor layer; bonding a carrier wafer to the protection layer; removing the substrate, the nucleation layer and a portion of the at least one semiconductor layer; disposing a diamond layer on the at least one semiconductor layer; bonding a substrate wafer to the diamond layer; and removing the carrier wafer and the protection layer.

According to one aspect of the present invention, a method for processing a semiconductor wafer includes: disposing and patterning a first metal layer on a semiconductor layer of a semiconductor wafer, wherein the semiconductor wafer includes a substrate wafer, a bonding layer, a diamond layer, an intermediate layer and the semiconductor layer; drilling one or more holes from the first metal layer toward the substrate wafer to thereby form one or more vias that extend from the first metal layer into the substrate wafer; disposing a second metal layer on the first metal layer and in a portion of the one or more vias; and removing the substrate wafer and the bonding layer to expose a surface of the diamond layer.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

One skilled in the art shall recognize: (1) that certain steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

Figure 1:
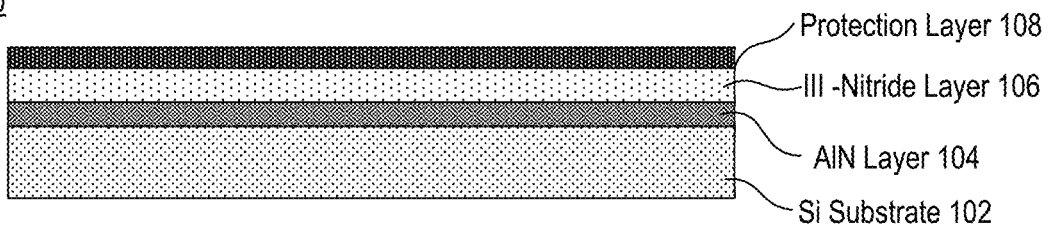
FIGS. 1-13 show an exemplary process for fabricating a wafer that includes two diamond layers and a III-Nitride layer according to embodiments of the present disclosure.

FIGS. 1-13 show an exemplary process for forming a wafer that includes a diamond layer and a III-Nitride layer (or, equivalently semiconductor layer that includes III-Nitride compound) according to embodiments of the present disclosure. As depicted in FIG. 1, the wafer 100 may include a silicon substrate 102, an AlN layer 104 and a III-Nitride layer 106, and a protection layer 108.

Figure 2A:
Figure 2B:
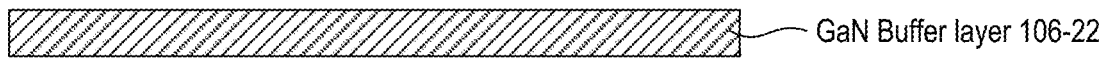

In embodiments, the III-Nitride layer 106 may include one or more layers that each include a GaN compound, such as hexagonal AlGaN/GaN, InAlN/GaN or cubic AlGaN/GaN. In the following sections, a III-Nitride layer may collectively refer to one or more layers that each include a III-Nitride compound. FIG. 2A shows an exemplary III-Nitride layer 106-1 that includes: a GaN buffer layer 106-14; and at least one of AlGaN layer and InAlN layer 106-12. (Hereinafter, the notation AlGaN/InAlN layer refers to one or more layers that each is formed of a material that includes at least one of AlGaN and InAlN.) FIG. 2B shows another exemplary III-Nitride layer 106-2 that includes only one GaN buffer layer 106-22.

In embodiments, the protection layer 108 may protect the III-Nitride layer 106 from thermal and mechanical damages that may occur during the subsequent processes. For instance, if the glass coating 112 (in FIG. 3) is directly attached to the III-Nitride layer 106, the mismatch of coefficients of thermal expansion (CTE) between the glass coating 112 and the III-Nitride layer 106 may generate stress on the III-Nitride layer 106, generating negative impact on the performance of semiconductor devices to be formed in the III-Nitride layer 106. In embodiments, the material and thickness of the protection layer 108 may be selected to mitigate the stress due to the mismatch of CTEs. In embodiments, the protection layer 108, which may be formed of a material that includes one or more of SiN, poly silicon, $Al_2O_3$, AlN and GaN, may be deposited by a suitable deposition technique.

In general, the large lattice mismatch between silicon in the silicon substrate 102 and GaN in the III-Nitride layer 106 may lead to cracks in the GaN buffer when cooling the heterostructure from the growth temperature to the room temperature. In embodiments, the AlN layer (or equivalently, nucleation layer) 104 may be formed on the silicon substrate 102 to prevent cracks in the GaN buffer layer 106-14 (or 106-22) and/or growth of the cracks to the AlGaN/InAlN layer 106-12. In embodiments, the AlN layer 104 and the III-Nitride layer 106 may be formed on the silicon substrate 102 by conventional wafer processing techniques, such as metal-organic chemical vapor deposition (MOCVD) technique.

Figure 3:
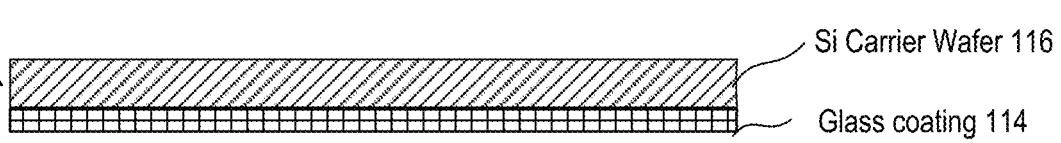
Figure 3:
Figure 3:
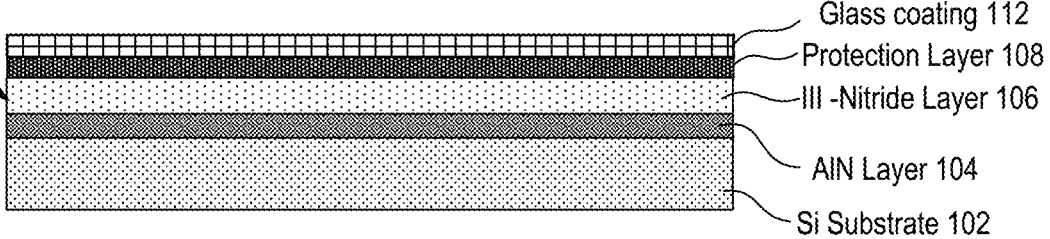
Figure 4:
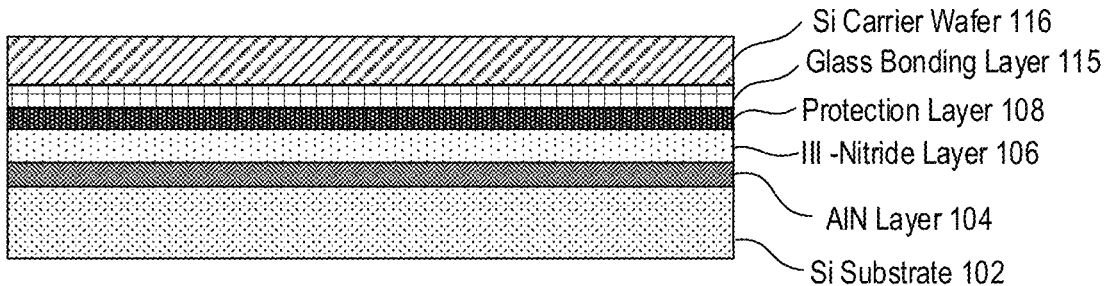

FIG. 3 shows a process of bonding a carrier wafer 113 to the wafer 109 according to embodiments of the present disclosure. As depicted, the carrier wafer 113 may include a silicon carrier wafer 116 and a glass coating 114 formed on its surface facing the wafer 109. In embodiments, the wafer 109 may be prepared by forming a glass coating on the protection layer 108. Then, the silicon carrier wafer 113 may be mounted on the wafer 109 and heated at the temperature of 900-1000° C. to melt the glass coatings 112 and 114 and to form a glass bonding layer. FIG. 4 shows a wafer 118 that may include the carrier wafer 113 bonded to the wafer 109 by the glass bonding process, where the glass bonding layer 115 may be formed by melting the glass coatings 112 and 114.

Figure 5:
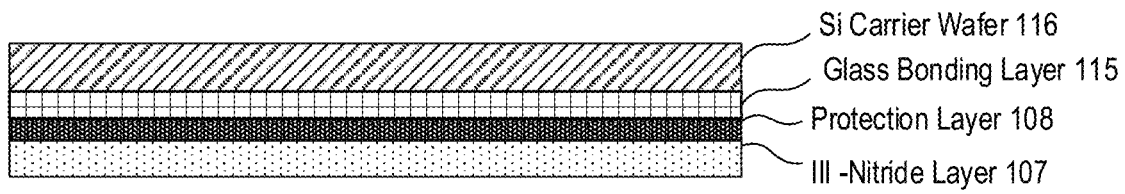

In embodiments, as depicted in FIG. 5, the silicon substrate 102, AN layer 104 and a portion of the III-Nitride layer 106 in the wafer 118 may be removed to form the wafer 120. In embodiments, the silicon substrate 102 may be removed by one or more of grinding, lapping, polishing and dry etching processes, even though other suitable process may be used to remove the silicon substrate 102. In embodiments, the AlN nucleation layer 104 may be removed by a wet etching process, even though other suitable process may be used to remove the AlN layer 104.

In embodiments, as discussed above in conjunction with FIG. 2A, the III-Nitride layer 106 may include the AlGaN/InAlN layer 106-12 and GaN layer 106-14. In alternative embodiment, as discussed above in conjunction with FIG. 2B, the III-Nitride layer 106 may include only GaN layer 106-22. In both cases, each of the GaN layers may include a portion near the interface between the GaN layer 106-22 and AlN layer 104, where the portion includes cracks developed during deposition of the GaN layer 106-22 and/or AlGaN/InAlN layer 106-12. As such, the portion of the GaN layer having the cracks may be removed so that the remaining GaN layer may not include any crack. In the wafer 120, the III-Nitride layer 107 refers to a III-Nitride layer that is formed by removing the portion of the GaN layer from the III-nitride layer 106.

Figure 6:
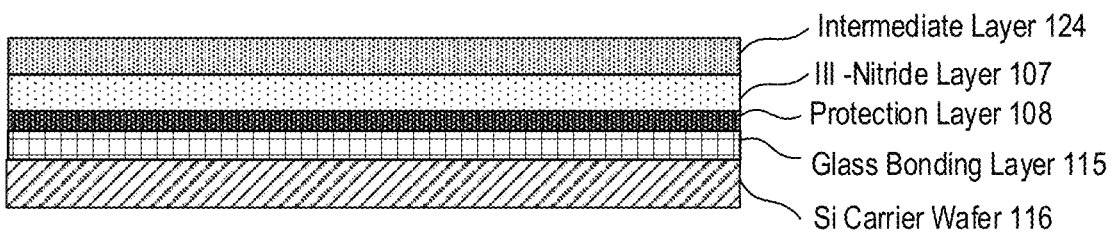

As depicted in FIG. 6, an intermediate layer 124 may be formed on the III-Nitride layer 107, where the intermediate layer 124 may include a first intermediate layer and a second intermediate layer (or which is al referred to as seed layer). If a diamond layer is directly deposited on the III-Nitride layer 107, the mismatch of coefficients of thermal expansion (CTE) between the diamond layer and the III-Nitride layer 107 may generate thermal stress on the III-Nitride layer 107 during formation of the diamond layer, and as such, the first intermediate layer may be deposited to mitigate the thermal stress. In embodiments, the material and thickness of the first intermediate layer may be selected to mitigate the stress due to the mismatch of CTEs. In embodiments, the first intermediate layer may be formed of a dielectric material, such as poly-Si, $SiO_2$, $Al_2O_3$ or SiN.

In embodiments, the second intermediate layer (i.e., a seed layer) may be formed on the top surface of the first intermediate layer. To form the seed layer, the wafer 122 may be submerged in an aqueous suspension of diamond nano particle (diamond seed particles) so that the top surface of the first intermediate layer may be in direct contact with the aqueous suspension. The diamond particles may be adsorbed onto the surface of the first intermediate layer, to thereby form the second intermediate (seed) layer. Depending on the exposure time in the suspension and the concentration of the diamond particles, the density of the particles in the seed layer may be determined. In embodiments, the diamond layer (128 in FIG. 7) may adhere to the seed layer better than to the first intermediate layer.

Figure 7:
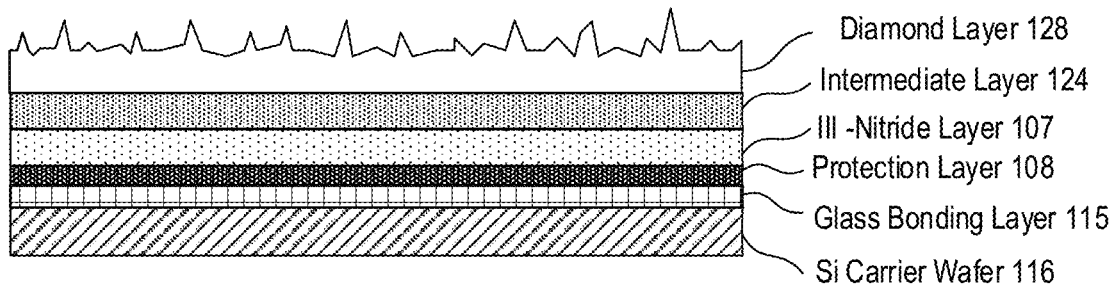
Figure 8:
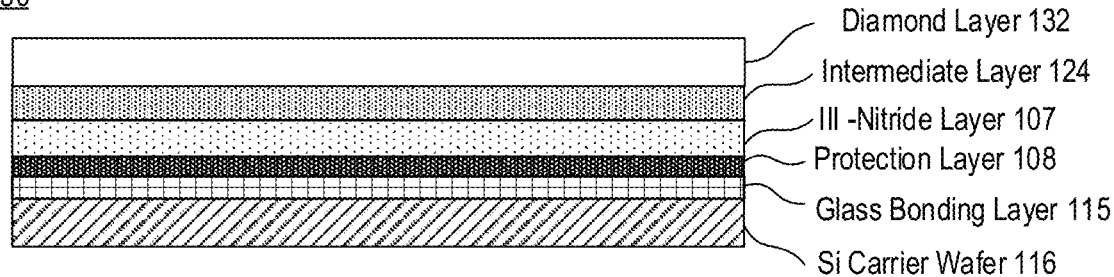

In embodiments, after forming the intermediate layer 124, the diamond layer 128 may be disposed on the intermediate layer 124, to thereby form the wafer 126 in FIG. 7. In embodiments, the diamond layer 128 may be formed by chemical vapor deposition (CVD) technique, even though other suitable techniques may be used. Then, a lapping process may be carried out to reduce the surface roughness of the diamond layer 128. In FIG. 8, the wafer 130 may include a diamond layer 132 that has a top surface with enhanced flatness by the lapping process.

Figure 9:
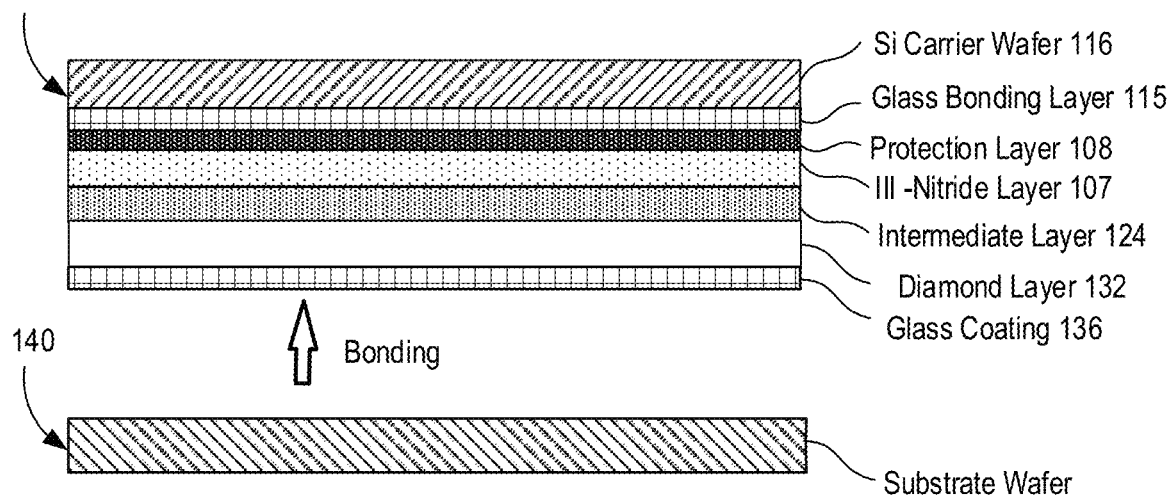

FIG. 9 shows a glass bonding process of two wafers 134 and 140 according to embodiments of the present disclosure. As depicted in FIG. 9, the wafer 134 may include a glass coating 136 formed on the diamond layer 132. In embodiments, the substrate wafer 140 may include one or more layers, as depicted in FIG. 10A-10B.

Figure 10A:
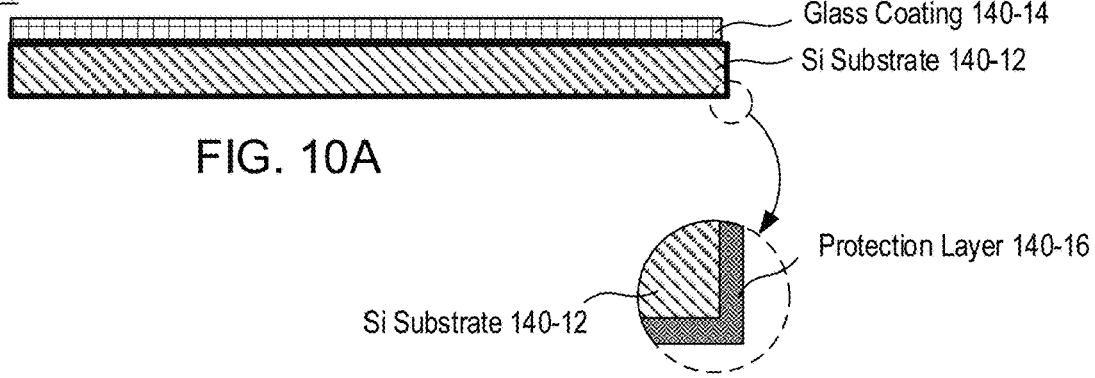

In FIG. 10A, the substrate wafer 140-1 may include a silicon substrate 140-12 and a protection layer 140-16 that may cover the entire portion of the substrate 142. As discussed below in conjunction with FIG. 12, the silicon carrier wafer 116 may be removed from the wafer 150 using the Tetramethylammonium hydroxide (TMAH) solution. In embodiments, the protection layer 140-16 may protect the silicon substrate 140-12 from the TMAH solution during the removal process of the silicon carrier wafer 116. In embodiments, the protection layer 140-16 may be formed of a material that includes one or more of Ti/Au, Cr/Au, SiN, $Al_2O_3$, and AlN, and may be deposited by a suitable deposition technique, such as sputtering or low pressure chemical vapor deposition (LPCVD) technique. In embodiments, the glass coating 140-14 may be formed on the protection layer 140-16. It is noted that the protection layer 140-16 may be formed of any other suitable material that does not react with the TMAH solution.

Figure 11:
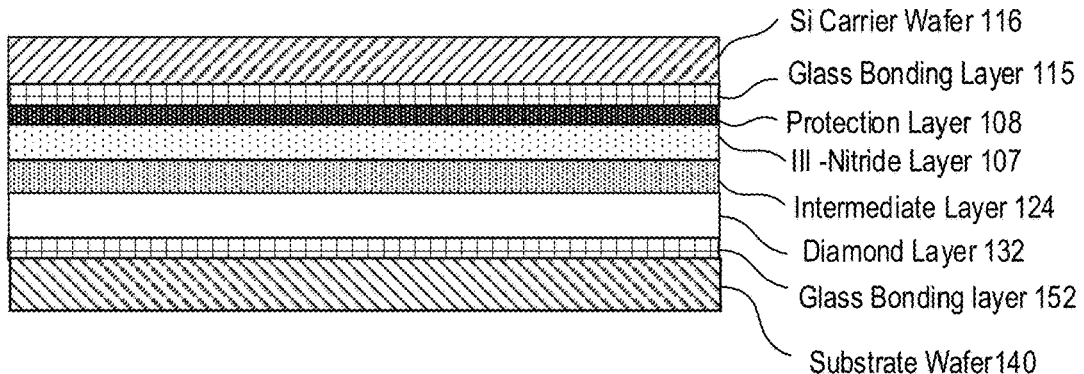

In the case where the substrate wafer 140-1 is used as the substrate 140 in FIG. 9, the wafer 134 may be mounted on the wafer 140-1, and both wafers may be heated at the temperature of 900-1000° C. to melt the glass coatings 136 and 140-14. FIG. 11 shows a wafer 150 that include the substrate wafer (or, shortly substrate) 140 bonded to the wafer 134 by the glass bonding process, where the glass bonding layer 152 may be formed by melting the glass coatings 136 and 140-14.

Figure 10B:
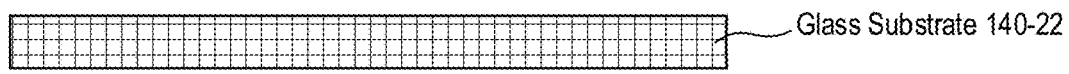

In FIG. 10B, the substrate wafer 140-2 may include a glass substrate 140-22. In the case where the substrate 140-2 is used as the substrate wafer 140 in FIG. 9, any protection layer may not be necessary since the TMAH solution does not react with glass. Also, any glass coating for the purpose of bonding the wafer 140-2 to the wafer 134 may not be necessary since the top portion of the substrate 140-22 may melt during the glass bonding process. Hereinafter, for the purpose of illustration, the substrate wafer (or shortly substrate) 140 may be one of the substrate wafers 140-1 and 140-2.

Figure 12:
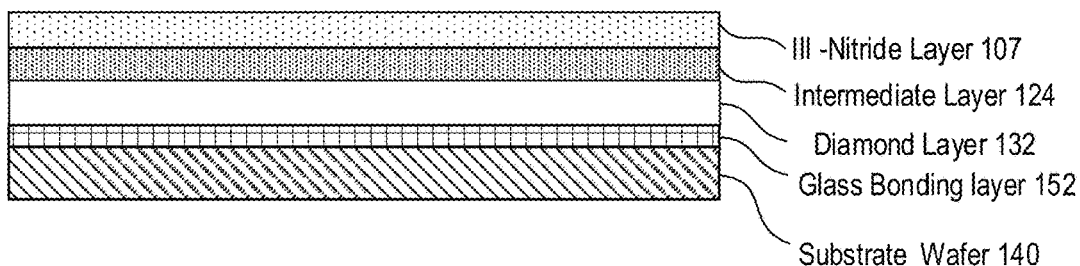

In embodiments, as shown in FIG. 12, the silicon carrier wafer 116, the glass bonding layer 115, and the protection layer 108 may be removed from the wafer 150 by a suitable process(es), to thereby form the wafer 156. For instance, the TMAH solution may be used to remove the silicon carrier wafer 116.

Figure 13:
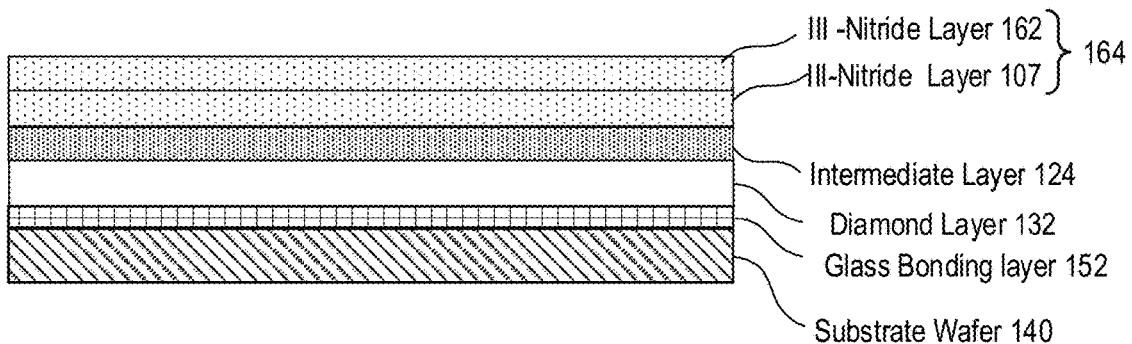

As discussed above in conjunction with FIGS. 2B and 5, the III-Nitride layer may have a GaN buffer layer only i.e., the III-Nitride layer 107 in the wafer 160 may include only GaN layer. In such a case, as shown in FIG. 13, another III-Nitride layer 162, such as AlGaN/InAlN layer, may be formed (regrown) on the GaN buffer layer, resulting in the III-Nitride layer stack 164. In the following sections, the III-Nitride layer stack 164 is referred to as a III-Nitride layer, even though more than one III-Nitride layer may be included in the III-Nitride layer 164.

In embodiments, an edge trimming process may be optionally performed on the wafer 160 to make primary/flat zone in the wafer 160 before shipping to a foundry for further processing of the wafer 160.

Figure 14:
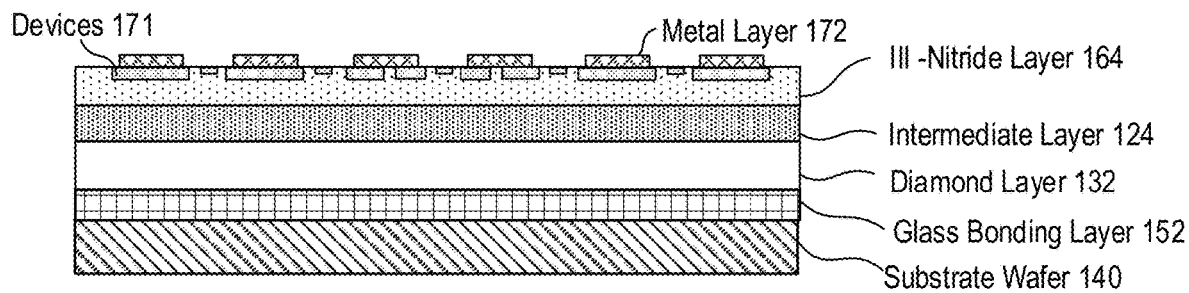
FIGS. 14-18 show an exemplary process for device processing the wafer in FIG. 13 to fabricate semiconductor devices according to embodiments of the present disclosure.

FIGS. 14-18 show an exemplary process for device processing the wafer 160 in FIG. 13 to fabricate semiconductor devices (such as HEMTs) according to embodiments of the present disclosure. In embodiments, as shown in FIG. 14, the wafer 170 may include various semiconductor devices 171, such as semiconductor transistors, formed in the III-Nitride layer 164. In embodiments, the semiconductor devices 171 may be formed by suitable semiconductor processes.

In embodiments, upon forming the semiconductor devices 171, a patterned metal layer 172 may be formed on the III-Nitride layer 164. In embodiments, the metal layer 172 may be formed of an ohmic alloy (preferably, but not limited to, Au, Ag, Ni, Ti, Al or any combination thereof) that alloys at 850° C. It is noted that various fabrication methods may be used to form the metal layer 172. In embodiments, the metal layer 172 may be annealed to reduce the contact resistance between the metal layer 172 and the III-Nitride layer 164. In embodiments, the metal layer 172 may be patterned by a suitable process, such as photolithography.

Figure 15:
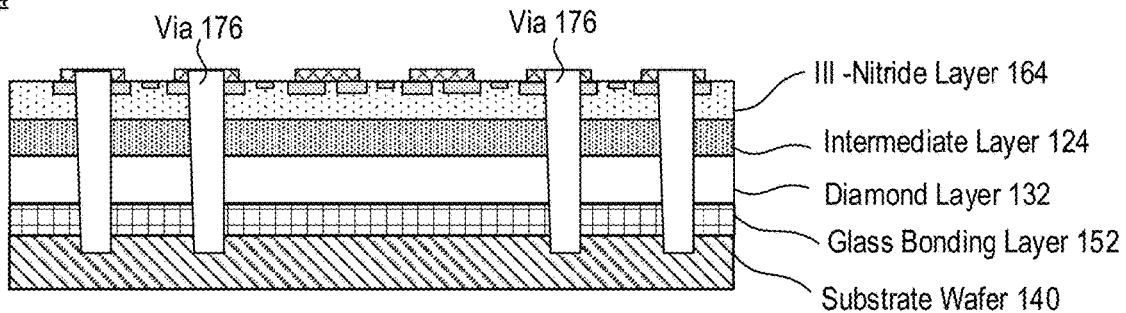

In embodiments, as shown in FIG. 15, the wafer 174 may include one or more vias 176 formed by a laser drilling technique or any other suitable technique. In the conventional techniques, vias are drilled from a substrate side toward a III-Nitride side of the wafer 170. If the conventional techniques using laser beams are performed to drill vias from the substrate wafer 140 toward the III-Nitride layer 164, the diamond layer 132, which may be formed of poly crystalline diamond, may scatter the laser beam, causing unintended subsidiary drilled spots or damages to the area of metal-semiconductor interface, especially gate contact area.

In contrast, in embodiments, the one or more vias 176 may be drilled from the metal layer 172 toward the substrate wafer 140. This drilling technique of the present disclosure may reduce the scattering of the laser beam by the diamond layer 132. Also, the heat energy, which may be accumulated in the gate contact area during the drilling process of the metal layer 172 and the III-Nitride layer 164, may be discharged to the diamond layer 132 by heat transfer, which further reduces the thermal damages to the III-Nitride layer 164. In embodiments, the one or more vias 176 may extend from the metal layer 172 into the substrate wafer 140.

Figure 16:
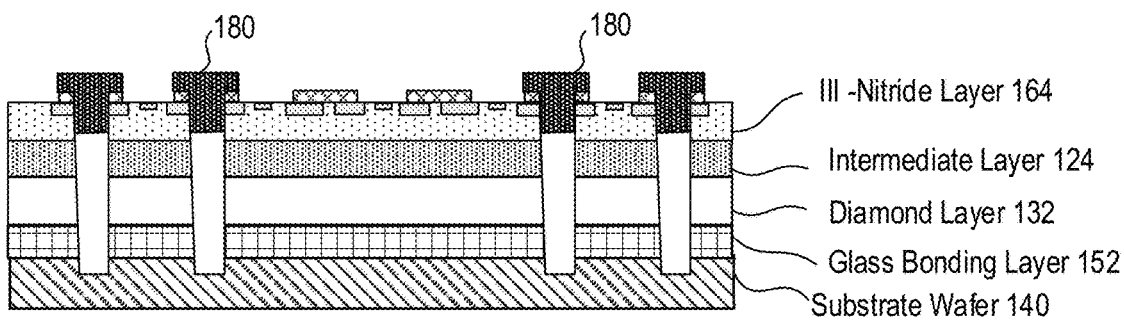
Figure 17:
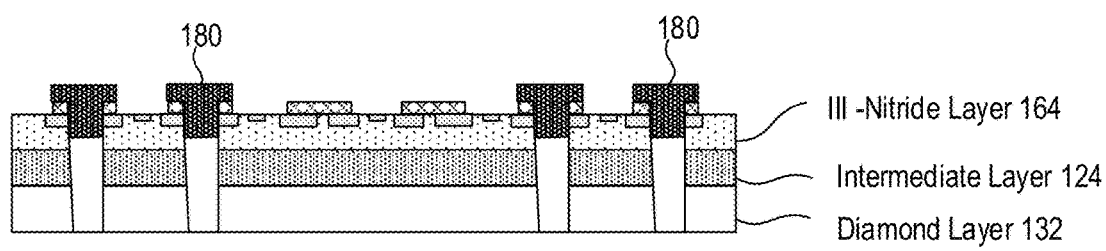

In embodiments, as shown in FIG. 16, a chemical or electrochemical gold plating technique may be used to deposit a thin layer of gold 180 on the metal layer 172 and in a top portion of the one or more vias 176. It is noted that other suitable metal may be used in place of the gold to form the metal layer 180 and other suitable techniques may be used to form the metal layer 180.

It is noted that the processes in FIGS. 14-16 are exemplary processes performed on the wafer 160. As such, it should be apparent to those of ordinary skill in the art that other suitable processes may be performed on the wafer 160 to form various semiconductor devices in the wafer 160.

As discussed above, in embodiments, the substrate wafer 140 may be bonded to the wafer 134 so as to bolster the mechanical strength of the wafer 134. As such, upon completion of the final passivation process (or any other process that may cause unintended mechanical deformation, such as bending and warping) of the wafer 178, the substrate wafer 140 may be removed from the wafer 178. In embodiments, the substrate wafer 140 and glass bonding layer 152 may be removed from the wafer 178 by a lapping process and/or any other suitable processes to thereby form the wafer 190, as shown FIG. 17. As described above, the substrate wafer 140 may be one of the substrate wafers 140-1 and 140-2. In embodiments, the substrate wafer 140-1 may be formed of silicon substrate 140-12 and the protection layer 140-16 that may cover the entire portion of the silicon substrate 140-12. In alternative embodiments, the substrate wafer 140-2 may include the glass substrate 140-22. In embodiments, upon removing the substrate wafer 140 and glass bonding layer 152, the bottom surface of the diamond layer 132 may be further cleaned by a dry etching technique so as to remove remaining glass material on the bottom surface of the diamond layer 132.

Figure 18:
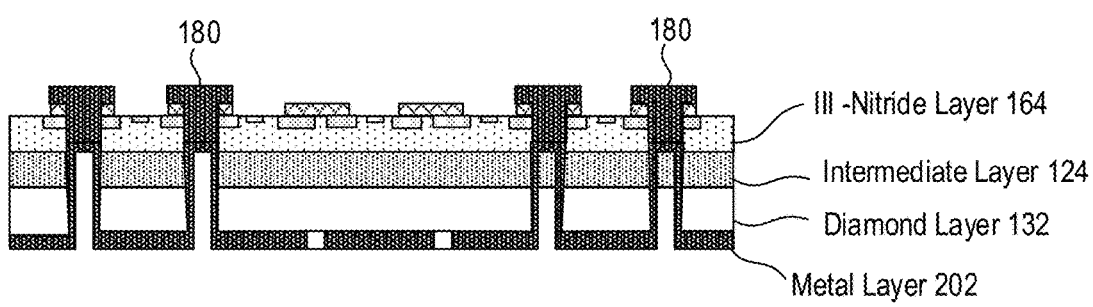

In FIG. 18, the wafer 200 may include a metal layer 202 that is deposited on the bottom surface of the diamond layer 132 and the side surfaces of the one or more vias 176 by the Au plating technique. It is noted that other suitable metal may be used in place of the gold for the metal layer 202, and other suitable techniques may be used to form the metal layer 202 on the diamond surface 132. In embodiments, the metal layer 202 may be in electrical contact with the metal layers 172 and 180 through the vias 176.

In embodiments, other processes, such as street etching, may be performed on the metal layer 202. Upon completion of the processes to form semiconductor devices in the wafer 200, the wafer 200 may be diced for singulation.

Figure 19:
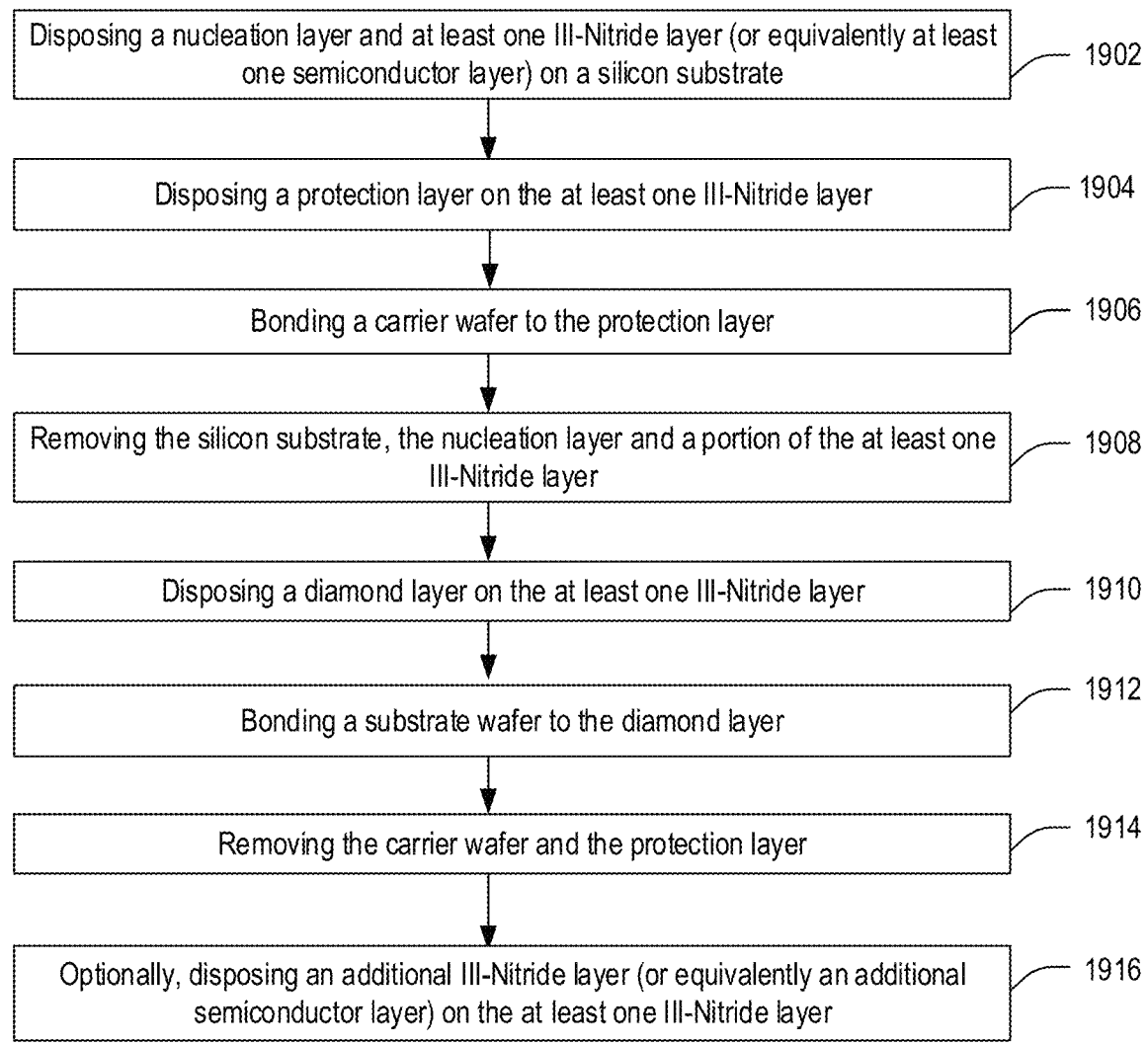
FIG. 19 shows a flowchart of an exemplary process for fabricating a semiconductor wafer according to embodiments of the present disclosure.

FIG. 19 shows a flowchart 1900 of an exemplary process for fabricating a semiconductor wafer according to embodiments of the present disclosure. At step 1902, the nucleation layer 104 and the III-Nitride layer (or equivalently, a semiconductor layer that includes a III-Nitride compound) 106 may be disposed on the silicon substrate 102. In embodiments, the nucleation layer 104 may be formed between the silicon substrate 102 and the III-Nitride layer to prevent cracks in the III-Nitride layer 106. In embodiments, the III-Nitride layer 106 may include only GaN buffer layer 106-22. In alternative embodiments, the III-Nitride 106 layer may include the GaN buffer layer 106-14 and the AlGaN/InAlN layer 106-12.

At step 1904, the protection layer 108 may be disposed on the III-Nitride layer 106, where the protection layer may be formed of a material that includes one or more of SiN, poly silicon, $Al_2O_3$, AlN and GaN.

At step 1906, the carrier wafer 113 having the silicon carrier wafer 116 may be bonded to the protection layer 108. In embodiments, the glass coating layers 112 and 114 may be formed on the protection layer 108 and silicon carrier wafer 116, respectively, and heated at the temperature of 900-1000° C. Then, at step 1908, the silicon substrate 102 and nucleation layer 104 may be removed.

It is noted that a portion of the III-Nitride layer 106 may be also removed at step 1908. In embodiments, when the III-Nitride layer 106 is formed of a GaN only, a portion of the GaN near the interface between the GaN layer 106-22 and nucleation layer 104 may include cracks developed during deposition of the GaN layer 106-22. Similarly, in alternative embodiments, when the III-Nitride layer 107 includes the GaN buffer layer 106-14 and the AlGaN/InAlN layer 106-12, a portion of the GaN layer near the interface between the GaN layer 106-14 and nucleation layer 104 may include cracks developed during deposition of the GaN layer 106-14 and/or the AlGaN/InAlN layer 106-12. In both cases, a portion of the GaN layer having the cracks may be removed so that the remaining III-Nitride layer 107 may not include any crack, at step 1908.

At step 1910, the diamond layer 128 may be disposed on the III-Nitride layer 107. In embodiments, to mitigate the stress due to the mismatch of CTEs of the diamond layer 128 and the III-Nitride layer 107, the intermediate layer 124 may be formed between the diamond layer 128 and the III-Nitride layer 107. In embodiments, the intermediate layer 124 may include first and second layers, where the first layer may mitigate the stress due to the mismatch of CTEs of the diamond layer 128 and the III-Nitride layer 107. In embodiments, the first layer may be formed of a dielectric material, such as poly-Si, $SiO_2$, $Al_2O_3$ or SiN. In embodiments, the second layer (which is also referred to as seed layer) may be disposed between the first layer and the diamond layer 128, where the seed layer may include diamond nano particle (diamond seed particles). In embodiments, after the step 1910 is completed, a lapping process may be carried out to enhance the surface flatness of the diamond layer 128.

At step 1912, the substrate wafer 140 may be bonded to the diamond layer 132, where the substrate wafer 140 may be one of the substrate wafers 140-1 and 140-2. In embodiments, the substrate wafer 140-2 may be formed of glass. In such a case, the glass coating 136 may be formed on the diamond layer 132; the wafer 134 may be mounted on the substrate wafer 140, and the wafers 134 and 140-2 may be heated at the temperature of 900-1000° C. for glass bonding.

In alternative embodiments, the substrate wafer 140-1 may include the silicon substrate 140-12 and the protection layer 140-16 covering the entire portion of the silicon substrate 140-12, where the protection layer 140-16 may be formed of a material that includes one or more of Ti/Au, Cr/Au, SiN, $Al_2O_3$, and AlN. In embodiments, the protection layer 140-16 may be formed of any other suitable material that does not react with the TMAH solution. Then, the glass coating 140-14 may be formed on the protection layer 140-16. Subsequently, the wafer 134 having the glass coating 136 formed on the diamond layer 132 may be mounted on the substrate wafer 140-1 having the glass coating 140-14, and the glass coatings 136 and 140-14 may be heated at the temperature of 900-1000° C. for glass bonding. In the wafer 150, the glass bonding layer 152 may be formed by meting the glass coatings 136 and 140-14, or the glass coating 136 and a top portion of the glass substrate 140-22.

At step 1914, the carrier wafer 113 and the protection layer 108 may be removed from the wafer 150. At step 1916, another III-Nitride layer (or equivalently, another semiconductor layer having a III-Nitride compound) 162 may be optionally disposed on the III-Nitride layer 107. In embodiments, when the III-Nitride layer 107 includes only the GaN buffer layer 106-22, an AlGaN/InAlN layer 162 may be formed on the GaN buffer layer.

Figure 20:
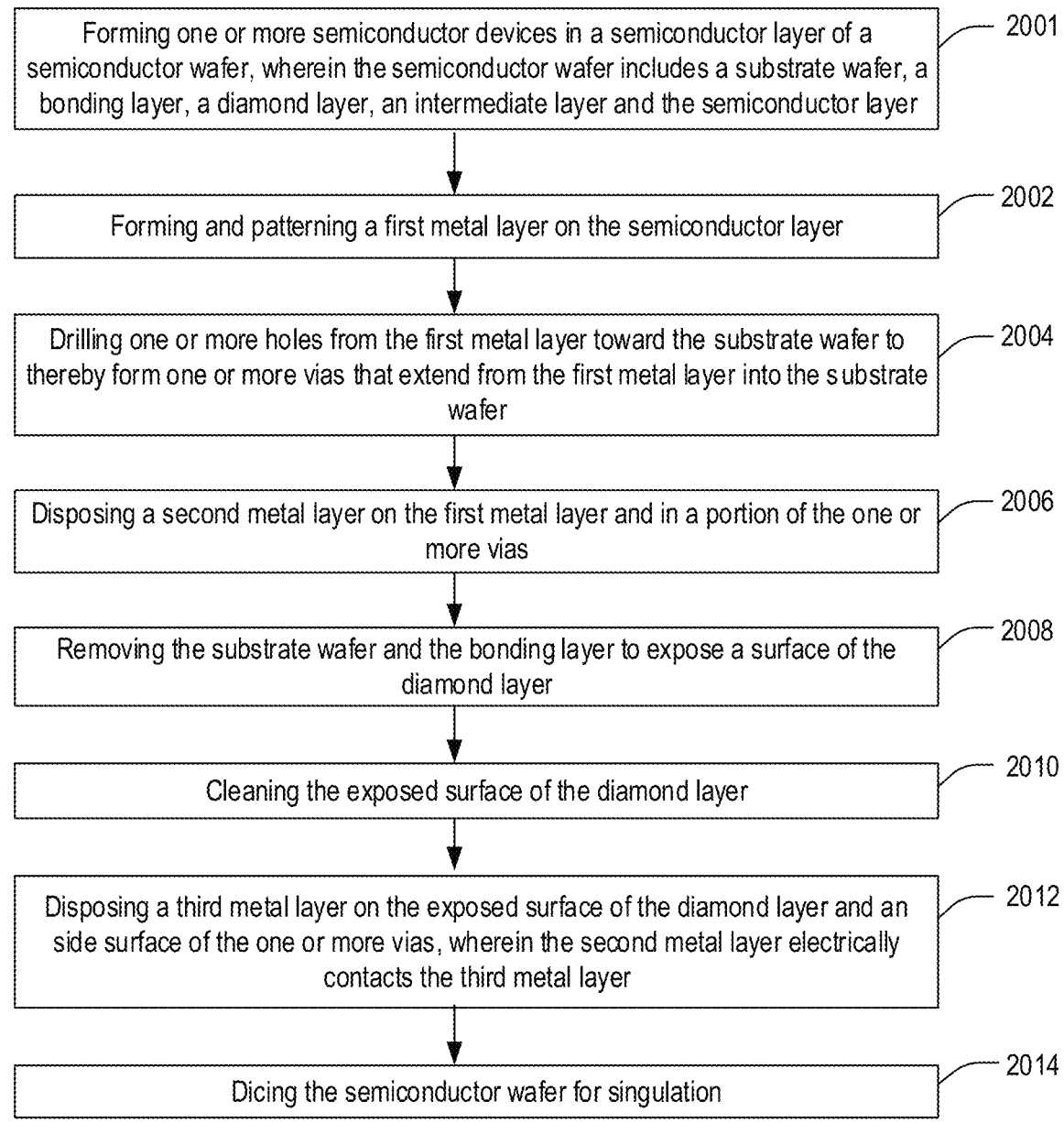
FIG. 20 shows a flowchart of an exemplary process for processing semiconductor devices according to embodiments of the present disclosure.

FIG. 20 shows a flowchart 2000 of an exemplary process for processing semiconductor devices according to embodiments of the present disclosure. At step 2001, semiconductor devices 171, such as semiconductor transistors, may be formed in the III-Nitride layer (or equivalently semiconductor layer) 164 of the semiconductor wafer 160. As discussed above, the semiconductor wafer 160 may include the substrate wafer 140, glass bonding layer 152, diamond layer 132, intermediate layer 124 and the III-Nitride layer 164. In embodiments, the substrate wafer 140 may be the wafer 140-1 that includes the protection layer 140-16 and silicon substrate 140-12. In alternative embodiments, the substrate wafer 140 may be the wafer 140-2 that includes the glass substrate 140-22. At step 2002, the metal layer 172 may be formed and patterned on the III-Nitride layer 164.

At step 2004, a laser drilling technique or any other suitable technique may be performed to drill one or more holes from the metal layer 172 toward the silicon wafer 140 to thereby form the one or more vias 176, where the one or more vias 176 may extend from the metal layer 172 into the substrate wafer 140. Then, at step 2006, the metal layer 180 may be formed on the metal layer 172 and in a top portion of the one or more vias 176. Next, at step 2008, the substrate wafer 140 and the glass bonding layer 152 may be removed to expose the bottom surface of the diamond layer 132. Optionally, in embodiments, the bottom surface of the diamond layer 132 may be further cleaned by a dry etching technique so as to remove the remaining glass material on the bottom surface of the diamond layer 132, at step 2010.

At step 2012, the metal layer 202 may be disposed on the exposed surface of the diamond layer 132 and the side surfaces of the one or more vias 176 by the Au plating technique. It is noted that other suitable metal may be used in place of the gold for the metal layer 202, and other suitable techniques may be used to form the metal layer 202 on the diamond surface 132. In embodiments, the metal layer 202 may be in electrical contact with the metal layers 172 and 180 through the vias 176. Then, at step 2014, the wafer 200 may be diced for singulation.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A method for processing a semiconductor wafer, comprising:
    disposing and patterning a first metal layer on a semiconductor layer of a semiconductor wafer, wherein the semiconductor wafer includes a substrate wafer, a bonding layer, a diamond layer, an intermediate layer and the semiconductor layer;
    drilling one or more holes from the first metal layer toward the substrate wafer to thereby form one or more vias that extend from the first metal layer into the substrate wafer;
    disposing a second metal layer on the first metal layer and in a portion of the one or more vias; and
    removing the substrate wafer and the bonding layer to expose a surface of the diamond layer.

2. The method of claim 1, wherein the substrate wafer and the bonding layer are removed by carrying out a lapping process.

3. The method of claim 1, further comprising:
    cleaning the exposed surface of the diamond layer.

4. The method of claim 3, wherein the exposed surface of the diamond layer is cleaned by dry etching.

5. The method of claim 1, further comprising:
    disposing a third metal layer on the exposed surface of the diamond layer and a side surface of the one or more vias, wherein the third metal layer electrically contacts the second metal layer.

6. The method of claim 5, wherein the third metal layer is disposed on the exposed surface of the diamond layer and the side surface of the one or more vias by plating.

7. The method of claim 6, wherein the third metal layer is a gold layer.

8. The method of claim 1, wherein the substrate wafer includes a silicon substrate covered by a protection layer that is formed of a material including one or more of Ti/Au, Cr/Au, SiN, Al2O3, and AlN.

9. The method of claim 1, wherein the substrate wafer includes a glass substrate.

10. The method of claim 1, wherein the bonding layer is formed of glass.

11. The method of claim 1, further comprising;
    forming one or more high electron mobile transistors in the semiconductor layer.

* * * * *